United States Patent [19]

Carr et al.

[11] 3,950,596
[45] Apr. 13, 1976

[54] ALTERING THE APPEARANCE OF CORUNDUM CRYSTALS

[75] Inventors: Ronald Ray Carr, Merrillville; Stephen Dale Nisevich, Munster, both of Ind.

[73] Assignee: Astrid Corporation, Limited, Hong Kong

[22] Filed: May 8, 1974

[21] Appl. No.: 467,937

Related U.S. Application Data

[63] Continuation of Ser. No. 210,140, Dec. 20, 1971, abandoned.

[52] U.S. Cl. .......... 428/539; 63/32; 106/42; 264/82; 427/140; 427/162; 427/164; 427/180; 427/201; 427/248; 427/255
[51] Int. Cl.$^2$... B32B 9/04; B32B 35/00; B05D 5/06
[58] Field of Search ........ 264/82, 62, 346; 106/42; 63/32; 117/100 A, 169 R, 121, 16, 106 R; 427/180, 218, 248, 140, 162, 164, 201, 255; 428/539

[56] References Cited
UNITED STATES PATENTS

| | | |
|---|---|---|
| 988,230 | 3/1911 | Verneuil .......................... 106/42 |
| 1,775,867 | 9/1930 | Sandmeier ....................... 106/42 |
| 1,814,219 | 7/1931 | Jaeger .............................. 106/42 |
| 2,448,511 | 9/1948 | Barnes et al. ................. 117/106 R |
| 2,488,507 | 11/1949 | Burdick et al. ................. 106/42 X |
| 2,690,630 | 10/1954 | Eversole et al. ................. 63/32 X |
| 3,420,780 | 1/1969 | Forrat et al. ..................... 106/42 X |
| 3,539,379 | 11/1970 | Mayer ................................ 63/32 X |
| 3,655,415 | 4/1972 | Keig et al. ......................... 63/32 X |
| 3,713,877 | 1/1973 | Kirchner et al. ............... 106/42 UX |

Primary Examiner—Ralph Husack
Assistant Examiner—Shrive P. Beck
Attorney, Agent, or Firm—Posnack, Roberts & Cohen

[57] ABSTRACT

A corundum crystal whose surface is altered by contact with a powdered metal oxide colorant at an elevated temperature within the range of 1600°C to a temperature below the fusion temperature of the said powder, said metal oxide colorant consisting essentially of an oxide of titanium and at least one metal oxide selected from the group consisting of iron, chromium, vanadium and nickel, said metal oxide colorant being sufficient to impart color to the surface of the crystal.

8 Claims, No Drawings

ALTERING THE APPEARANCE OF CORUNDUM CRYSTALS

The invention relates to a process for altering the appearance of corundum crystals. The process is useful as a means for changing the color of natural or synthetic corundum crystals, and as a means for correcting or masking certain color defects that are most frequently encountered in synthetic corundum crystals. An understanding of the manner by which such defects may arise will be enhanced by a brief review of certain of the known methods for producing synthetic corundum crystals.

Synthetic corundum crystals of gem quality are produced commercially by the Verneuil or oxyhydrogen-flame process. In a typical Verneuil process, alumina powder is fed from a hopper with a fine mesh screen bottom into an oxygen stream. The oxygen flows downwardly through the central tube of an oxhydrogen burner. Hydrogen is fed to the flame through an annular passage surrounding the central tube. The flame from the burner is discharged into a furnace containing a ceramic pedestal. The pedestal is centered in the furnace below the bottom tip of the central tube of the burner, and at a predetermined vertical distance below said tip.

The powder is fed intermittently through the central tube by tapping the hopper with a hammer. The powder falling through the flame builds up as a mass, either on the pedestal or on the tip of a thin corundum crystal supported on the pedestal. As the powder builds up on the upper surface of this mass, the pedestal is lowered in order to maintain a constant distance between the bottom tip of the central tube and the top of the growing crystal. The powder feed rate is adjusted at first so that the diameter of the growing crystal increases. When the diameter has attained the desired dimension, the powder feed rate is adjusted to maintain this diameter. When the flame temperature, powder feed rate, and pedestal withdrawal rate are properly coordinated, a cylindrical monocrystalline mass of corundum (i.e., alpha-alumina), known as a boule, is grown. The boule is then heat-treated or annealed at about 1900°–1950° C. in a controlled atmosphere (i.e., oxidizing or reducing) for one to two days to help relieve stresses in the boule.

The alumina powder that is employed as the feed is produced by calcining pure alum (i.e., hydrated ammonium aluminum sulfate). When alum alone is used, the alumina powder obtained therefrom is used to produce water-white or colorless sapphire. The production of colored sapphires and rubies is attained by adding various metal salts to the alum. The metal salts are ultimately converted to oxides in the finished corundum crystals. The metal oxide colorant additives are called "dopants".

Fuller descriptions of the oxyhydrogen-flame or Verneuil process for growing synthetic corundum crystals may be found in U.S. Pat. Nos. 988,230 and 1,004,505, and in Volume 7, pages 157 et seq., of the Kirk-Othmer *Encyclopedia of Chemical Technology* (The Interscience Encyclopedia, Inc.; New York).

Synthetic asteriated corundum crystals are also produced commercially. The basic process for their production is described in U.S. Pat. No. 2,488,507, to Burdick and Glenn. Briefly, the process for producing asteriated corundum crystals is a modification of the Verneuil process wherein a titanium-doped alumina powder is employed for growing the boule. The resultant boule, which comprises an alumina crystal having a titanium oxide dissolved therein, is subjected to a heat treatment to precipitate fine, needle-like crystals of a titanium compound along prominent crystallographic planes of the alumina crystal. The asterism is caused by these needle-like crystals.

An improved process for producing asteriated corundum crystals is disclosed by Burdick and Jones, in U.S. Pat. No. 2,690,062. In this process, called the "flux process", the temperature at the surface of the growing boule is fluctuated, usually by varying the oxygen feed rate. The crystal then grows in a series of thin, longitudinally distributed upwardly convex transverse layers. Alternate ones of said layers have the titania distributed across the full widths thereof, whereas the rest of the layers have titania concentrated adjacent the periphery. In cutting a gem stone en cabochon from a boule grown by this flux process, the rounded upper surface of the cabochon coincides approximately with the contours of said layers.

The Verneuil process and its modifications described above, are critical to carry out. The process requires the successful coordination of several parameters. To name just a few, the rate of powder feed, the flame temperature at the surface of the growing crystal, and the rate at which the supporting pedestal for the growing crystal is lowered, must all be coordinated within narrow limits. Even a temporary lack of coordination can cause a defective area in the growing crystal. For this reason, there is a significant proportion of gemstones produced from Verneuil process boules that have color defects. Such defects include the following:

1. Non-uniform color. First, a gemstone can have a clear or a dark area as a result of some of the dopant being non-uniformly distributed in that area. The gemstones so defective appear darker in said area unless they are held up to the light. The area then appears to be clear. (This defect can also occur in natural sapphires.) Second, distinct bands can sometimes be seen in a gemstone cut from a boule grown by the flux method. Such boules normally contain alternating dark ($TiO_2$-rich) and light ($TiO_2$-poor) layers. However, banding is normally not visible to the naked eye because the layers are impalpably thin. However, if a layer is thicker than usual, it can be seen by the naked eye where it intersects the surface of the gemstone. Such thicker layers can occur as a result of the temperature failing to fluctuate for one or more cycles, a temporary increase in the alumina powder flow, a variation in the withdrawal rate of the pedestal, or the like; and 2. Undesired color — By "undesired color" is meant a color having a hue, brilliance, or saturation that is relatively less valuable in a gemstone. Synthetic corundum can have undesired color for a variety of reasons. For instance, the wrong atmosphere during the annealing step can cause the color to be off-specification, i.e., undesired. To illustrate, when producing ruby-colored corundum, if the atmosphere is insufficiently oxidizing, the corundum will have a bluish tinge. This defect may not be apparent until a gemstone has been cut and ground from the boule. Another cause of undesired color in synthetic corundum is the wrong quantity of dopant. Too much dopant causes the color saturation to be too high, and too little dopant causes low saturation. Of course, natural sapphires can also have undesired color.

It is an object of the invention to provide a process for altering the appearance of corundum crystals.

It is another object of the invention to provide a process for altering the color of corundum crystals.

A further object of the invention is to provide a process for producing corundum crystals having uniform color from corundum crystals having non-uniform color.

Briefly, the process of the invention comprises subjecting a corundum crystal to elevated temperature while maintaining the surface of said crystal in contact with a powder comprising a major proportion of alumina and a minor proportion of a metal oxide colorant, in order to alter the appearance of said crystal.

In a first important aspect, the invention provides a process for correcting non-uniform color in a corundum crystal. Thus, corundum crystals having clear areas and corundum crystals exhibiting banding can be subjected to the process of the invention to produce thereby corundum crystals whose color appears uniform. In a second important aspect, the invention provides a process for changing the color of corundum cyrstals. Thus, corundum crystals of one color are subjected to the process to produce thereby corundum crystals having another color whose hue, brilliance, or saturation is different from said one color.

The process is carried out by subjecting corundum crystal (which has already been shaped into the form of a gemstone) to elevated temperature while maintaining the surface of the crystal in contact with a powder comprising a major proportion of alumina and a minor proportion of a metal oxide colorant for a period of time sufficient to either change the color of the crystal or to correct the defect of non-uniform color. The crystals can be immersed in said powder, which can be contained in a crucible in a natural gas fired oven. Care should be taken to prevent the crystals from making direct contact with each other. The elevated temperature employed will normally be within the range of from about 1600° to about 1850° C. A preferred temperature range is from about 1700° to about 1800° C. At temperatures below 1600° C., the process becomes uneconomically slow, and if the temperature becomes too high, surface damage of the corundum crystal can occur. In particular, if the powder contains substantial amounts of titanium oxide, temperatures much above 1800° C. should be avoided for the reason that the titanium oxide lowers the melting point of the powder. If fusion of the powder occurs, the surface of the corundum crystal will be damaged.

The crystals are maintained at the treating temperature for a period of time sufficient to alter the appearance of the crystals. To illustrate, the times can vary from about 20 hours to about 200 hours, depending upon the exact nature of the crystal being treated. For instance, highly polished gemstones require longer treatment time than those that have not been polished. The atmosphere in the treating oven is normally an oxidizing atmosphere, although in some cases a reducing atmosphere is employed, especially when treating blue sapphires, as is more fully discussed below. To obtain an oxidizing atmosphere, natural gas (which is predominantly methane, although it contains some higher gaseous hydrocarbons) is burned in the oven in a natural gas to oxygen volume ratio of about 1 to 2.5.

To obtain a reducing atmosphere, the natural gas to oxygen ratio can be about 1 to 1.5.

In the event that the corundum crystal is to be asteriated, the crystal can be subjected to a conventional asteriating heat treatment after it has been subjected to the process of the invention. Such conventional asteriating heat treatments are disclosed in U.S. Pat. Nos. 2,488,507; 2,690,062 and 2,690,630.

The powder employed in the process of the invention comprises a major proportion of alumina and a minor proportion of alumina and a minor proportion of a metal oxide colorant. Such colorants are oxides of metals such as iron, chromium, vanadium, cobalt, magnesium, nickel, and titanium, which impart color to corundum.

The powder can be produced by calcining alum containing a compound of the appropriate metal or metals. Mechanical mixing of the alum and the metal compound is unnecessary since the alum goes through a liquid phase during the calcining. Thorough mixing is achieved automatically as the alum pases through this liquid phase. Examples of metal compounds that can be added to the alum in order to incorporate therein a metal oxide colorant include titanium tetrachloride, ammonium dichromate, ferric ammonium sulfate, cobaltous sulfate nickel sulfate, ammonium metavanadate, and magnesium sulfate.

The calcining conditions for the production of the powder can vary from a temperature of from about 1850° to about 2050° F. for a period of from about 2 about 5 hours. For instance, calcining at a temperature of about 1920° F. for about 3 hours is useful. The calcining can be carried out in any suitable oven or furnace, such as a natural gas fired oven using an air:natural gas volume ratio of about 10:1.

In a preferred aspect of the invention, when the process is carried out to change the color of corundum crystal, the powder contains alumina and at least one oxide of iron, chromium, cobalt, nickel, vanadium, or magnesium. The powder can also contain an oxide of titanium, especially when the corundum is to be asteriated after having been subjected to the process of the invention.

In another preferred aspect, when the process is employed to correct the defect of non-uniform color, the powder contains alumina and at least one oxide of iron, chromium, cobalt, nickel, vanadium, magnesium, or titanium, Again, the powder will usually contain titanium dioxide if the corundum crystal is to be asteriated after having been subjected to the process of the invention.

The following specific Examples illustrate the practice of the invention:

EXAMPLE 1

Production of Powder 1.75 Pounds of crystalline hydrated ammonium aluminum sulfate is charged to an alumina crucible. The crucible is placed in a natural gas fired oven along with other crucibles containing the same charge, and rapidly (within 15 to 20 minutes) heated from room temperature up to 1920° F. The crucibles are held at that temperature for 3 hours, and then cooled. The contents of the crucibles are then poured through a screen into a suitable container. The yield is about 0.2 pound of alumina powder per crucible.

Various metal oxide colorants are incorporated in the powder by adding aqueous solutions of metal compounds to the hydrated ammonium aluminum sulfate prior to the calcining step. Table I, below, displays the quantity of representative aqueous metal compound solutions of the indicated concentration required to achieve the indicated concentration of metal oxide in the alumina powder, the percent concentration being based upon total weight of powder (i.e., alumina plus the metal oxide colorant).

TABLE I

| Metal Compound | Concentration, Wt. % In Aqueous Solution | Quantity Added To Alum. ml. | Weight % Metal Oxide in Alumina Powder |
|---|---|---|---|
| Titanium Tetrachloride $TiCl_4$ | 35 | 100 | 22, $TiO_2$ |
| Ferric ammonium sulfate $Fe(SO_4)_3(NH_4)_2SO_4 \cdot 24 H_2O$ | 11.6 | 22 | 0.5, $Fe_2O_3$ |
| Ammonium dichromate $(NH_4)_2Cr_2O_7$ | 12.05 | 100 | 6, $Cr_2O_3$ |
| Cobaltous Sulfate $CoSO_4 \cdot 7 H_2O$ | 56.5 | 125 | 30, CoO |
| Nickelous Sulfate $NiSO_4 \cdot 6 H_2O$ | 19.5 | 100 | 6, NiO |
| Magnesium Sulfate $MgSO_4 \cdot 7 H_2O$ | 22 | 100 | 4, MgO |

EXAMPLE 2

Deep blue sapphire crystals having non-uniform surface color (banding or clear areas), and/or having too low color saturation are subjected to a temperature of 1750° C. in a reducing atmosphere for 30 hours, embedded in alumina powder containing 0.25 weight per cent ferric oxide and 13 weight per cent titanium dioxide (here and in subsequent examples, the percentages are based on total weight of powder). After this treatment, the crystals have a uniform, deep blue color.

When iron oxide is included in the alumina powder, the powder tends to sinter. However, good results have been achieved in correcting defective deep blue sapphire by using alumina powder containing from about 0.1 to about 0.5 weight percent ferric oxide, and from about 12 to about 18 weight percent titanium dioxide. Within these ranges of metal oxide colorants, at most only moderate sintering is encountered while the process is at least 90 percent successful in correcting defects.

EXAMPLE 3

Purple sapphire crystals having a reddish tinge, and red sapphire (i.e., ruby) crystals having non-uniform color or too low color saturation, are subjected to a temperature of 1750° C. for 96 hours in an oxidizing atmosphere, while being embedded in alumina powder containing 6 weight per cent chromia. The crystals so treated have a uniform ruby-red appearance. If asterism is desired in the crystals, the alumina can also contain 22 weight percent titanium dioxide.

EXAMPLE 4

Yellow sapphire crystals having non-uniform color or off-specification color saturation (i.e., either too high or too low color saturation), are subjected to a temperature of 1750° C. for 48 hours in an oxidizing atmosphere, while being embedded in alumina powder containing from 3 to 6 weight per cent chromia, and 24 weight percent titanium oxide. The crystals so treated have a uniform salmon pink color.

EXAMPLE 5

Yellow sapphire crystals having non-uniform color or whose color saturation is too low are subjected to a temperature of 1750° C. for 96 hours in an oxidizing atmosphere, while embedded in alumina powder containing 2.5 weight percent nickel oxide, 3.5 weight percent chromia, and 15 weight per cent titanium dioxide. After this treatment, the color of the crystals is a uniform light gray-green.

EXAMPLE 6

Pink sapphire crystals whose color is non-uniform, black sapphire crystals whose color is non-uniform, and milky white sapphire crystals having non-uniform color, are subjected to a temperature of 1750° C. for 96 hours in an oxidizing atmosphere while embedded in alumina powder containing 22 weight percent titanium oxide. The crystals are uniform in color (pink, black, or white, respectively) after this treatment.

EXAMPLE 7

Milky white sapphire crystals having non-uniform color or undesired color (such as a grayish tinge), are subjected to a temperature of 1750° C. for 96 hours in an oxidizing atmosphere while being embedded in alumina powder containing 6 weight percent chromia and 22 weight percent titanium dioxide. After this treatment, the crystals have a uniform pink appearance.

EXAMPLE 8

Pale blue sapphire crystals having non-uniform color are subjected to a temperature of 1750° C. for 96 hours in a reducing atmosphere while embedded in an alumina powder containing 10–15 weight percent titanium oxide. After this treatment, the crystals are a uniform pale blue (azure) in color.

What is claimed is:

1. A corundum crystal initially having a non-uniform color appearance whose surface is altered by contact with a powdered metal oxide colorant at an elevated temperature within the range of 1600° C to a temperature below the fusion temperature of the said powder, said metal oxide colorant consisting essentially of an oxide of titanium and at least one metal oxide selected from the group consisting of iron, chromium, vanadium and nickel, said metal oxide colorant being sufficient to impart to the surface of the crystal a uniform color appearance.

2. The corundum crystal of claim 1 wherein said crystal is an asteriated crystal.

3. The corundum crystal of claim 1 wherein at leaast one said metal oxide is an oxide of chromium.

4. The corundum crystal of claim 1 wherein at least one said metal oxide is an oxide of iron.

5. A corundum crystal initially having a first color appearance whose surface is altered by contact with a powdered metal oxide colorant at an elevated temperature within the range of 1600° C to a temperature below the fusion temperature of the said powder, said metal oxide colorant consisting essentially of an oxide of titanium and at least one metal oxide selected from the group consisting of iron, chromium, vanadium and nickel, said metal oxide colorant being sufficient to impart to the surface of the crystal a second color appearance different from the first color appearance.

6. The corundum crystal of claim 5 wherein said crystal is an asteriated crystal.

7. The corundum crystal of claim 5 wherein at least one said metal oxide is an oxide of chromium.

8. The corundum crystal of claim 5 wherein at least one said metal oxide is an oxide of iron.

* * * * *